(12) United States Patent
Li et al.

(10) Patent No.: US 12,347,733 B2
(45) Date of Patent: Jul. 1, 2025

(54) DIE SEPARATION RING FOR WAFERS HAVING A LARGE DIE ASPECT RATIO

(71) Applicant: Sandisk Technologies, Inc., Milpitas, CA (US)

(72) Inventors: Shuo Li, Shanghai (CN); Xiangyang Liu, Shanghai (CN); Xiaodong Liu, Shanghai (CN); Xuri Xin, Shanghai (CN); Weiting Jiang, Shanghai (CN); Zhenghao Wu, Shenzhen (CN); Bo Yang, Dublin, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 460 days.

(21) Appl. No.: 17/750,864

(22) Filed: May 23, 2022

(65) Prior Publication Data
US 2023/0377972 A1    Nov. 23, 2023

(51) Int. Cl.
*H01L 21/68* (2006.01)
*H01L 21/687* (2006.01)
*H01L 21/78* (2006.01)
*H10D 89/00* (2025.01)

(52) U.S. Cl.
CPC .... *H01L 21/7806* (2013.01); *H01L 21/68721* (2013.01); *H10D 89/013* (2025.01)

(58) Field of Classification Search
CPC .......... H01L 21/7806; H01L 21/7684
USPC ........................................ 438/462
See application file for complete search history.

(56) References Cited

U.S. PATENT DOCUMENTS

| | | | |
|---|---|---|---|
| 4,203,127 A | 5/1980 | Tegge, Jr. | |
| 8,373,269 B1 | 2/2013 | Hsiao et al. | |
| 10,403,538 B2 | 9/2019 | Iwanaga et al. | |
| 11,171,031 B2 | 11/2021 | Sherbin et al. | |
| 2010/0240189 A1* | 9/2010 | Jeong | H01L 21/7684 438/653 |
| 2020/0203227 A1 | 6/2020 | Cayabyab et al. | |
| 2021/0183683 A1 | 6/2021 | Sherbin et al. | |

FOREIGN PATENT DOCUMENTS

| | | |
|---|---|---|
| JP | 2011216508 A | 10/2011 |
| JP | 2013026544 A | 2/2013 |
| JP | 2013098394 A | 5/2013 |
| JP | 2015173203 A | 10/2015 |
| JP | 2023098549 A | 8/2023 |
| KR | 20180007850 A | 1/2018 |

(Continued)

OTHER PUBLICATIONS

Japan Patent Office, "Notice of Reasons for Refusal," for Japanese Patent Application No. 2024-529319, Mar. 11, 2025.

*Primary Examiner* — Phuc T Dang
(74) *Attorney, Agent, or Firm* — DENTONS Durham Jones Pinegar

(57) ABSTRACT

A die separation ring that causes non-uniform expansion of a semiconductor wafer during a semiconductor wafer expansion process. The die separation ring includes an annular body that extends about a central axis. The annular body of the die separation ring includes a first portion having a first elevation and a second portion having a second elevation that is lower than the first elevation. A third portion extends between the first portion and the second portion forming a transition between the first portion and the second portion.

20 Claims, 5 Drawing Sheets

(56) References Cited

FOREIGN PATENT DOCUMENTS

| | | | | |
|---|---|---|---|---|
| KR | 20210052997 A | * | 5/2021 | ......... H01L 21/7684 |
| KR | 20210058606 A | | 5/2021 | |
| WO | 2018079536 A1 | | 8/2021 | |

* cited by examiner

DIE SEPARATION RING FOR WAFERS HAVING A LARGE DIE ASPECT RATIO

BACKGROUND

Semiconductor wafer dicing is a manufacturing process in which individual dies on a semiconductor wafer are cut and subsequently separated. There are many techniques for dicing a semiconductor wafer including scribing, sawing and laser cutting.

For example, in a laser dicing process, a laser forms a number of scribe lines or cracks in an interior layer of the semiconductor wafer. The semiconductor wafer then undergoes an expansion process. The expansion process typically includes mounting the semiconductor wafer on dicing tape and causing an expansion ring located beneath the dicing tape to be elevated. As the expansion ring moves to the elevated position, the dicing tape uniformly expands toward an outer edge of the semiconductor wafer. Expansion of the dicing tape causes the cracks in the interior layer of the semiconductor wafer to propagate to the front and back surfaces of the semiconductor wafer thereby forming individual dies.

However, in some cases, the dies on the semiconductor wafer may have a large aspect ratio. As such, uniform expansion may cause uneven spacing between the dies due to, for example, a difference in scribe lines and/or a kerf along a short side of each die versus a long side of each die. Uneven spacing may result in the dies not being fully separated and/or the dies of the semiconductor wafer not being recognized during a subsequent image recognition process associated with the die manufacturing process.

Accordingly, it would be advantageous for an expansion ring to cause dicing tape to expand different amounts or degrees in different directions depending on an aspect ratio of the dies in the semiconductor wafer.

SUMMARY

The present application describes a die separation ring that may be used to separate dies in a semiconductor wafer having large aspect ratios (e.g., aspect ratios of 4:1 or more). The die separation ring of the present application includes features that cause an expansion material (e.g., dicing tape) on which a semiconductor wafer has been mounted to expand a first degree or amount in a first direction and a second degree or amount in a second direction during a die separation/wafer expansion process. Causing the expansion material on which the semiconductor wafer is mounted to expand in different degrees enables spacing between a long side of the die and a short side of the die to be more uniform when compared to a die separation/wafer expansion process in which the semiconductor wafer is expanded in a uniform manner.

Accordingly, the present application describes a die separation ring that includes an annular body that extends about a central axis. The annular body has a top and a bottom. In an example, the top of the annular body includes a first planar surface and a second planar surface. The first planar surface has a first elevation with respect to the bottom of the annular body. Likewise, the second planar surface has a second elevation with respect to the bottom of the annular body. In an example, the second elevation is lower than the first elevation. The die separation ring also includes a third non-planar surface. The third non-planar surface extends between the first planar surface and the second planar surface. In an example, the first planar surface is arranged to contact expansion material associated with a semiconductor wafer which causes the expansion material to expand in a first direction when the die separation ring is moved in a direction parallel to the central axis from a first position to a second position. Likewise, the second planar surface is arranged to contact the expansion material associated with the semiconductor wafer to cause the expansion material to expand in a second direction when the die separation ring is moved from the first position to the second position. In an example, the expansion in the second direction is less than the expansion in the first direction.

The present application also describes a die separation ring that includes a first substantially planar portion having a first height and a second substantially planar portion having a second height. In an example, the second height is lower than the first height. The die separation ring also includes a non-planar transition portion that connects the first substantially planar portion and the second substantially planar portion.

Also described is a die separation ring that includes an annular body extending about a central axis. The annular body has a top and a bottom. In an example, the top of the annular body includes a first expansion means having a first elevation with respect to the bottom of the annular body and a second expansion means having a second elevation with respect to the bottom of the annular body. The second elevation is lower than the first elevation. The annular body also includes a non-planar surface that extends between the first expansion means and the second expansion means. In an example, the first expansion means causes an expansion material associated with a semiconductor wafer to expand in a first direction and the second expansion means causes the expansion material associated with the semiconductor wafer to expand in a second direction. The expansion in the second direction is less than the expansion in the first direction.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1A:
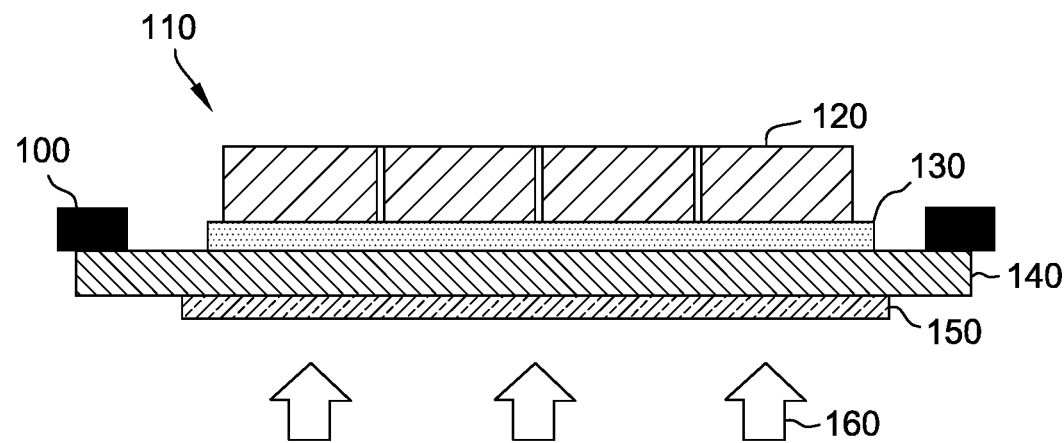
FIG. 1A-FIG. 1B illustrate a typical expansion ring and associated expansion process according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

Semiconductor wafer dicing is a manufacturing process in which dies are separated from a semiconductor wafer. Today, there are many different semiconductor wafer dicing techniques. For example, a semiconductor wafer may be cut or diced using a scribing and breaking technique. In another example, the semiconductor wafer may be diced using a mechanical saw or a laser.

In some semiconductor processing techniques, the semiconductor wafer undergoes an expansion process after the initial dicing process. For example, in a laser dicing process, a laser forms a number of scribe lines or cracks in an interior layer of the semiconductor wafer. An expansion process is then used to separate the individuals dies.

For example, the semiconductor wafer may be mounted on dicing tape (either before or after the initial dicing process) and the dicing tape is secured to an expansion device. The expansion device causes an expansion ring located beneath the dicing tape to move from a first position to a second position or an elevated position. As the expansion ring moves to the elevated position, the dicing tape uniformly expands toward an edge of the semiconductor wafer. Expansion of the dicing tape causes the cracks in the interior layer of the semiconductor wafer to propagate to the front and back surfaces of the semiconductor wafer thereby forming individual dies.

Uniform expansion typically works well for dies that have uniform or small aspect ratios. However, in some examples, a die in a semiconductor wafer may have a large aspect ratio (e.g., a 4:1 or greater aspect ratio). If a semiconductor wafer having dies with a large aspect ratio undergoes a uniform expansion process, the dies may be unevenly spaced. This may be caused by differing scribe lines and/or differing kerf width along a long side of each die with respect to a short side of each die. Uneven spacing may cause a variety of issues including, but not limited to, dies not being fully separated during the expansion process and/or a die not being recognized during a subsequent image recognition process associated with the die manufacturing process.

In order to address the above, the present application describes a die separation ring that causes non-uniform expansion of a semiconductor wafer during a semiconductor wafer expansion process. For example, the die separation ring described herein includes an annular body extending about a central axis. The die separation ring includes a first portion having a first elevation and a second portion having a second elevation that is lower than the first elevation. A third portion extends between the first portion and the second portion forming a transition between the first portion and the second portion.

In an example, the first portion of the die separation ring having the first elevation (e.g., the higher elevation) is aligned with longer sides of the dies in the semiconductor wafer and the second portion of the die separation ring having the second elevation (e.g., the lower elevation) is aligned with shorter sides of the dies in the semiconductor wafer. As the die separation ring moves parallel to the central axis from a first position to a second position or to an elevated position (e.g., ten millimeters or more), the first portion contacts the expansion material (on which the semiconductor wafer is mounted) before the second portion.

As the die separation ring continues to move toward the second position, the first portion causes the expansion material to expand or stretch in a first direction (e.g., an X direction) by a first expansion degree or amount. As the die separation ring continues to move to the elevated position, the second portion contacts the expansion material and causes the expansion material to expand in a second direction (e.g., a Y direction) by a second expansion degree or amount.

In this example, the first expansion degree (or an expansion distance) is greater than the second expansion degree. The difference in expansion degrees of the expansion material causes the dies having large aspect ratios in the semiconductor wafer to be more evenly spaced during an expansion process when compared to an expansion process in which an expansion material undergoes a uniform expansion process as is typically performed using a typical expansion ring.

Although the die separation ring of the present disclosure causes non-uniform expansion of the expansion material, the non-uniform expansion causes uniform spacing between dies having a large aspect ratios. This helps ensure that the dies having large aspect ratios are fully separated during the semiconductor wafer expansion process. Additionally, uniform spacing between dies having large aspect ratios may also help reduce issues (e.g., alarms, dies not being recognized) during an image recognition process associated with the die manufacturing process.

These and other examples will be described in more detail with respect to FIG. 1A-FIG. 7.

Figure 1B:
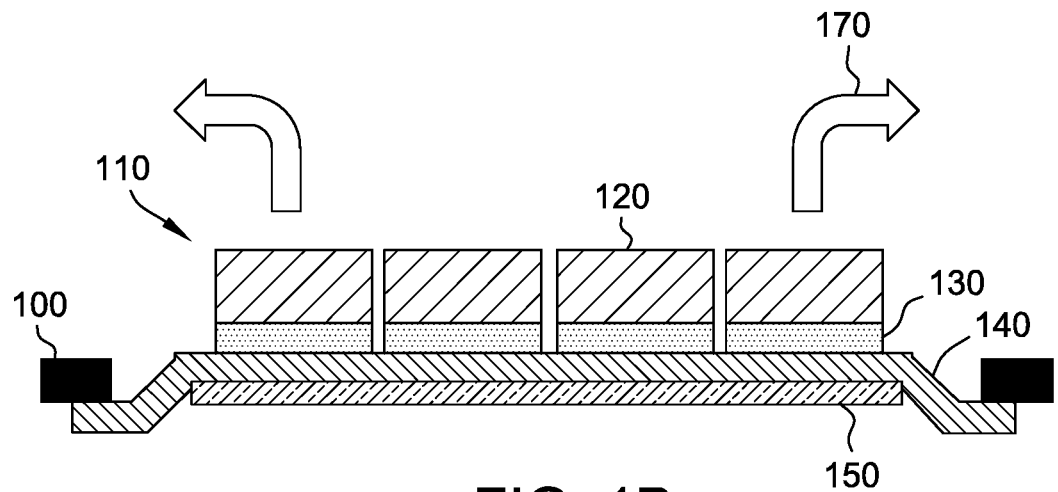

FIG. 1A and FIG. 1B illustrate a typical expansion ring 150 for a die separation device 100 according to an example. The expansion ring 150 may be used by the die separation device 100 to provide uniform expansion to a semiconductor wafer 110 during a semiconductor wafer expansion process.

As shown in FIG. 1A, the semiconductor wafer 110 may include a number of dies 120. The semiconductor wafer 110 may be mounted on dicing tape 140—either before or after the semiconductor wafer 110 undergoes a wafer dicing process such as described above. In some examples, a die attached film (DAF) 130 may be provided between the semiconductor wafer 110 and the dicing tape 140.

During a semiconductor wafer expansion process (shown in FIG. 1B), the expansion ring 150 moves upward (shown by arrows 160) and causes the dicing tape 140 to uniformly expand (represented by arrows 170). During the semiconductor wafer expansion process, the dies 120 and the DAF 130 are typically separated.

The semiconductor wafer expansion process shown and described with respect to FIG. 1A and FIG. 1B is effective for dies having a uniform or small aspect ratios. However, for dies that have a large aspect ratio (e.g., an aspect ratio of 4:1 or greater), uniform expansion may cause uneven kerf between different sides of the dies and/or may not fully separate the dies and/or the associated DAF.

Figure 2:
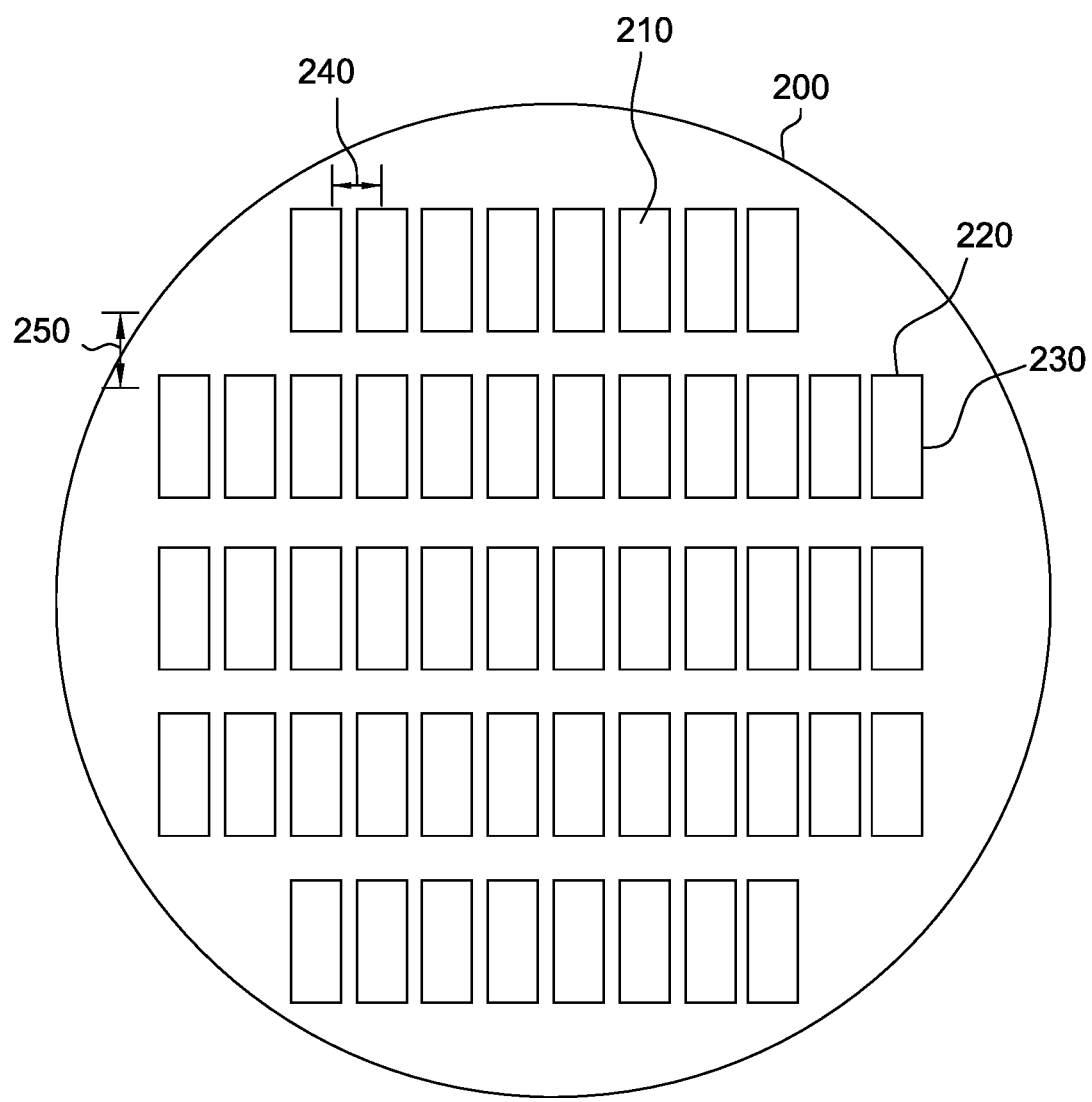
FIG. 2 illustrates results of a typical expansion ring expanding a semiconductor wafer, having dies with large aspect ratios, in a uniform manner according to an example.

FIG. 2 illustrates a semiconductor wafer 200 having dies 210 with a large aspect ratio (e.g., an aspect ratio of 4:1 or greater). In the example shown in FIG. 2, the semiconductor wafer 200 has undergone a semiconductor wafer expansion process using a typical expansion ring (e.g., the expansion ring 150 (FIG. 1A)).

As shown in FIG. 2, the uniform semiconductor wafer expansion process caused an uneven kerf between the short side 220 of each die 210 and the long side 230 of each die 210. For example, a kerf width (represented by arrows 240) between long sides 230 of adjacent dies 210 of the semiconductor wafer 200 may be smaller when compared to a kerf width (represented by arrows 250) between short sides 220 of adjacent dies 210 in the semiconductor wafer 200. In addition to causing uneven kerf width between the dies 210, the uniform expansion process may not fully separate each of the dies 210 and/or may not fully separate any DAF provided between the semiconductor wafer 200 and the dicing tape.

Figure 3:
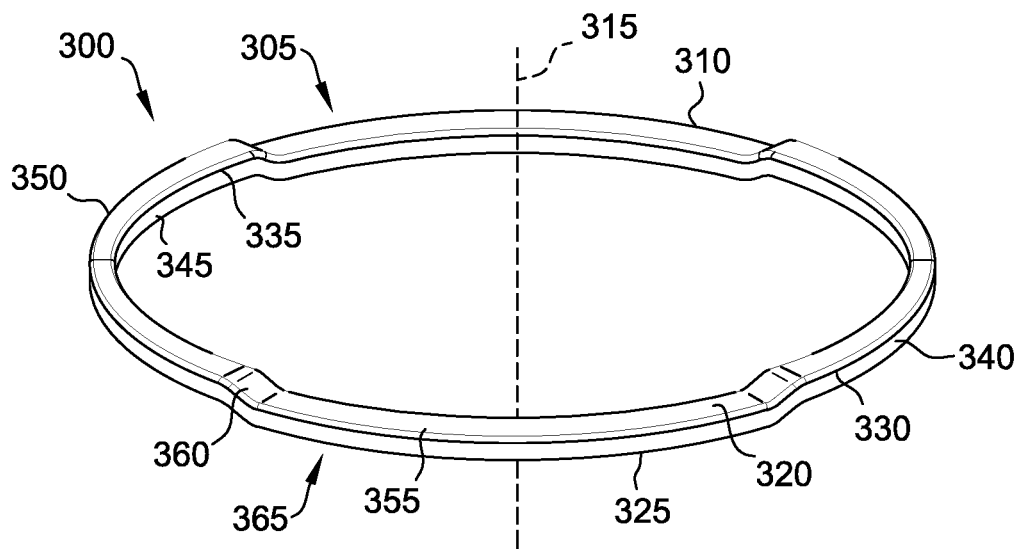
FIG. 3 illustrates a die separation ring that may be used to separate dies having large aspect ratios according to an example.

FIG. 3 illustrates a die separation ring 300 for separating dies having a large aspect ratio (e.g., an aspect ratio of 4:1 or greater) according to an example. The die separation ring 300 may be used in a die separation device or wafer expander device that performs a die separation process or semiconductor wafer expansion process. For example, the die separation ring 300 may be used in any die separation device (e.g., die separation device 100) that currently uses a typical expansion ring (e.g., expansion ring 150 (FIG. 1A)).

In an example, the die separation ring 300 may be made of any suitable material. Examples include, but are not limited to, metal, aluminum, steel, stainless steel or the like. In another example, the die separation ring 300 may be made of a polymer.

The die separation ring 300 includes an annular body 310 extending about a central axis 315. The die separation ring 300 may have a radius of one hundred seventy millimeters. Although one hundred seventy millimeters is specifically mentioned, the radius of the die separation ring 300 may be greater than one hundred seventy millimeters or less than one hundred seventy millimeters. The die separation ring 300 may have a width of ten millimeters. In other examples, the die separation ring 300 may have a width less than ten millimeters or greater than ten millimeters.

The die separation ring 300 may include an inner sidewall 345 and an outer sidewall 340. The inner sidewall 345 and the outer sidewall 340 may extend circumferentially about the center axis 315. The inner sidewall 345 may define an inner radius and the outer sidewall 340 may define an outer radius. As such, a width of the annular body 310 may be defined by a difference between the inner radius and the outer radius.

The annular body 310 has a top 305 and a bottom 365. The top 305 includes a top surface 320 and the bottom 365 includes a bottom surface 325 opposite the top surface 320. In an example, the top surface 320 (or portions of the top surface 320) are planar or substantially planar. Likewise, the bottom surface 325 (or portions of the bottom surface 325) are planar or substantially planar.

The annular body 310 may also include an outer edge 330 and an inner edge 335. In an example, the outer edge 330 connects the top surface 320 to the outer sidewall 340. Likewise, the inner edge 335 connects the top surface 320 to the inner sidewall 345 that is opposite from the outer sidewall 340. The inner sidewall 345 and the outer sidewall 340 extend between the top surface 320 and the bottom surface 325. The bottom surface 325 may also include an inner edge and an outer edge such as previously described.

In an example, the inner edge 330 and/or the outer edge 335 may be rounded. In another example, the inner edge 330 and/or the outer edge 335 may be angled with respect to top surface 320, the inner sidewall 345 and/or the outer sidewall 340. In yet other examples, the inner edge 330 and/or the outer edge 335 may have any shape that reduces a "sharpness" of an edge (e.g., an edge that may potentially cut or damage expansion material when the die separation ring 300 is used to expand the expansion material and a semiconductor wafer that is mounted on the expansion material such as will be described in greater detail below) of the die separation ring 300.

The die separation ring 300 may be configured in a "wave" or an "S" shape. For example and as shown in FIG. 3, the die separation ring 300 may include a first portion 350 and a second portion 355. The top surface 320 of the first portion 350 may be elevated or otherwise have a higher elevation with respect to the top surface 320 of the second portion 355. Likewise, the bottom surface 325 of the first portion 350 may be elevated or otherwise have a higher elevation with respect to the bottom surface 325 of the second portion 355.

The die separation ring 300 may also include a third portion 360 or transition portion. The third portion 360 extends between the first portion 350 and the second portion 355. In an example, the top surface 320 and/or the bottom surface 325 of the third portion 360 is non-planar. For example, the third portion 360 may extend from the first portion 350 to the second portion 355 at a slope or an angle. In another example, the third portion 360 may be rounded. In yet another example, the third portion 360 may have a "step" shape (e.g., have an angle of approximately ninety degrees) with respect to the top surface 320 of the first portion 350 and/or the top surface 320 of the second portion 355.

In some examples, a difference in elevation between the top surface 320 of the first portion 350 and the top surface 320 of the second portion 355 is approximately three millimeters or less. In another example, the difference in elevation between the top surface 320 of the first portion 350 and the top surface 320 of the second portion 355 is approximately four millimeters or less. Although three and four millimeters are specifically mentioned, the difference in elevation between the top surface 320 of the first portion 350 and the top surface 320 of the second portion 355 may be greater than four millimeters.

For instance, in some examples, the difference in elevation between the top surface 320 of the first portion 350 and the top surface 320 of the second portion 355 is based on, or is otherwise proportional to, a die aspect ratio of a die in a semiconductor wafer. For example, if the die aspect ratio of the die in semiconductor wafer is 4:1, the difference in elevation between the top surface 320 of the first portion 350 and the top surface 320 of the second portion 355 may be four millimeters. However, if the die aspect ratio of the die in semiconductor wafer is 5:1, the difference in elevation between the top surface 320 of the first portion 350 and the top surface 320 of the second portion 355 may be five millimeters. Although specific die aspect ratios and elevations are given, these are for example purposes only.

As discussed above, the annular body 310 includes a bottom 365 having a bottom surface 325. In the example shown in FIG. 3, the shape of the bottom surface 325 mirrors the shape of the top surface 320. For example, the bottom surface 325 of the first portion 350 may be planar or substantially planar. Likewise, the bottom surface 325 of the second portion 355 may be planar or substantially planar. However, the bottom surface 325 of the third portion 360 may be non-planar as it transitions between the first portion 350 and the second portion 355.

Because the shape of the bottom surface 325 mirrors the shape of the top surface 320, a height of the annular body 310 of the die separation ring 300 may be consistent or substantially consistent around the circumference of the die expansion ring. For example, although the top surface 320 of the first portion 350 may have a higher elevation when compared to the top surface 320 of the second portion 355, the height of the first portion 350, the second portion 355 and/or the third portion 360 may be similar or substantially similar around the circumference of the die separation ring 300.

Figure 4:
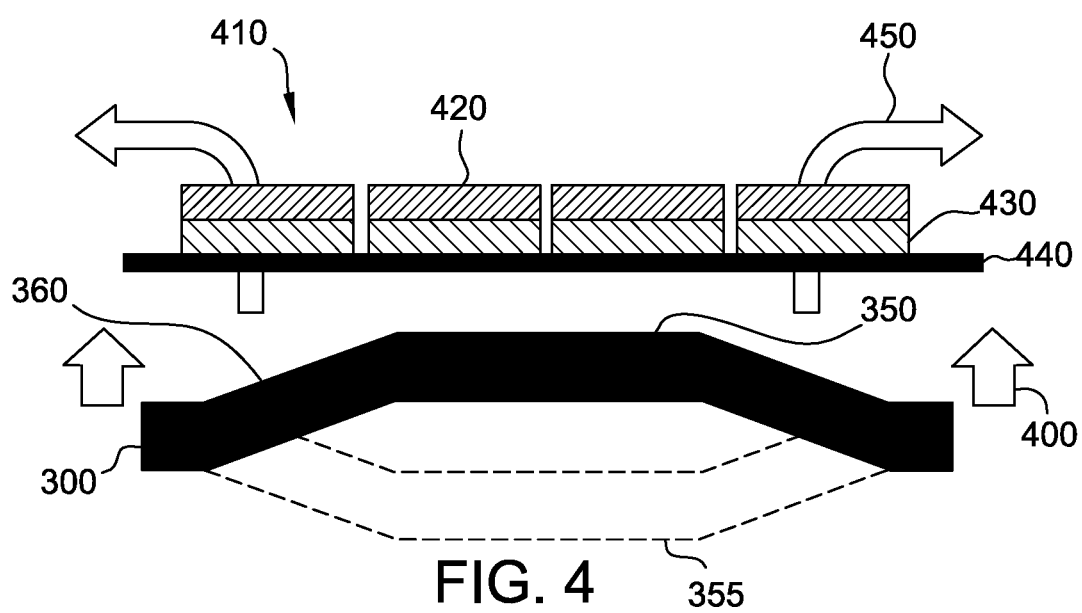
FIG. 4 illustrates how the die separation ring of FIG. 3 provides non-uniform expansion in different directions according to an example.

FIG. 4 illustrates the die separation ring 300 of FIG. 3 being used in a die separation device to separate dies 420 of a semiconductor wafer 410. In an example, the dies 420 have a large die aspect ratio (e.g., an aspect ratio of 4:1 or greater).

In the example shown in FIG. 4, the semiconductor wafer 410 is mounted on an expansion material 440 (e.g., dicing tape). The semiconductor wafer 410 may be mounted on the expansion material 440 before or after a dicing process. In an example, die attached film (DAF) 430 may be provided between the semiconductor wafer 410 and the expansion material 440.

During the wafer expansion process, the die separation device causes the die separation ring 300 to move from a first position to a second position (e.g., an elevated position) represented by arrows 400. The movement of the die separation ring 300 may be parallel to a central axis (e.g., the central axis 315 (FIG. 3)) of the die separation ring 300. In an example, the die separation ring 300 may be moved ten millimeters or more. In another example, the die separation ring 300 may be moved less than ten millimeters.

As the die separation ring 300 moves from the first position to the second position, the top surface 320 of the elevated first portion 350 contacts the expansion material 440 and causes the expansion material 440 to expand in a first direction (e.g., in an X direction).

As the die separation ring 300 continues to move to the second position, the top surface 320 of the non-elevated second portion 355 contacts the expansion material 440 and begins causing the expansion material 440 to expand in a second direction (e.g., a Y direction). However, due to the difference in elevation between the elevated first portion 350 and the non-elevated second portion 355, expansion of the expansion material 440 (represented by arrows 450) is not uniform. For example, the die separation ring 300 causes expansion in the first direction (e.g., the X direction) to be greater than expansion in the second direction (e.g., the Y direction). Although the expansion material 440 may not uniformly expand, spacing between the long sides of adjacent dies 420 in the semiconductor wafer 410 and the short sides of adjacent dies 420 in the semiconductor wafer 410 will be substantially uniform.

Figure 5:
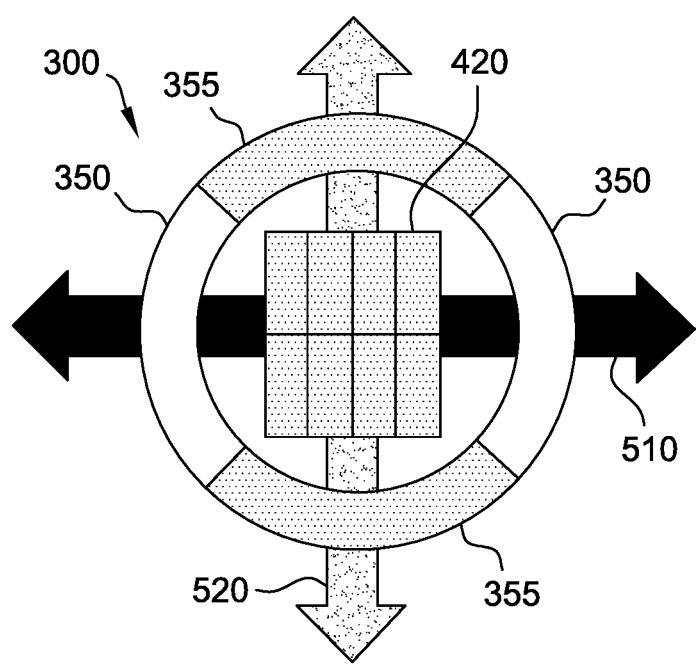
FIG. 5 illustrates how a first portion of the die separation ring of FIG. 3 having a first elevation causes an expansion material associated with a semiconductor wafer to expand in a first direction by a first amount or degree and how a second portion of the die separation ring of FIG. 3 having a second elevation causes the expansion material associated with the semiconductor wafer to expand in a second direction by a second amount or degree according to an example.

FIG. 5 illustrates expansion characteristics of the die separation ring 300 of FIG. 3 according to an example. As previously discussed, the die separation ring 300 includes a first portion 350 having a top surface that is elevated with respect to a top surface of a second portion 355. In the example shown, the elevated first portion 350 of the die separation ring 300 aligns with a long side of a die 420 of a semiconductor wafer. Likewise, the non-elevated second portion 355 of the die separation ring 300 aligns with a short side of a die 420 of the semiconductor wafer.

As previously described, as the die separation ring 300 moves from a first position to a second position during the wafer expansion process, the elevated first portion 350 contacts expansion material and begins to cause the expansion material to expand in a first direction (represented by arrow 510). As the die separation ring 300 continues to move toward the second position, the non-elevated second portion 355 contacts the expansion material and begins to cause the expansion material to expand in a second direction (represented by arrow 520). Due to the difference in elevation between the first portion 350 of the die separation ring 300 and the second portion 355 of the die separation ring 300, expansion (e.g., an amount or distance of expansion of the expansion material) in the first direction 510 is greater than expansion in the second direction 520.

Figure 6:
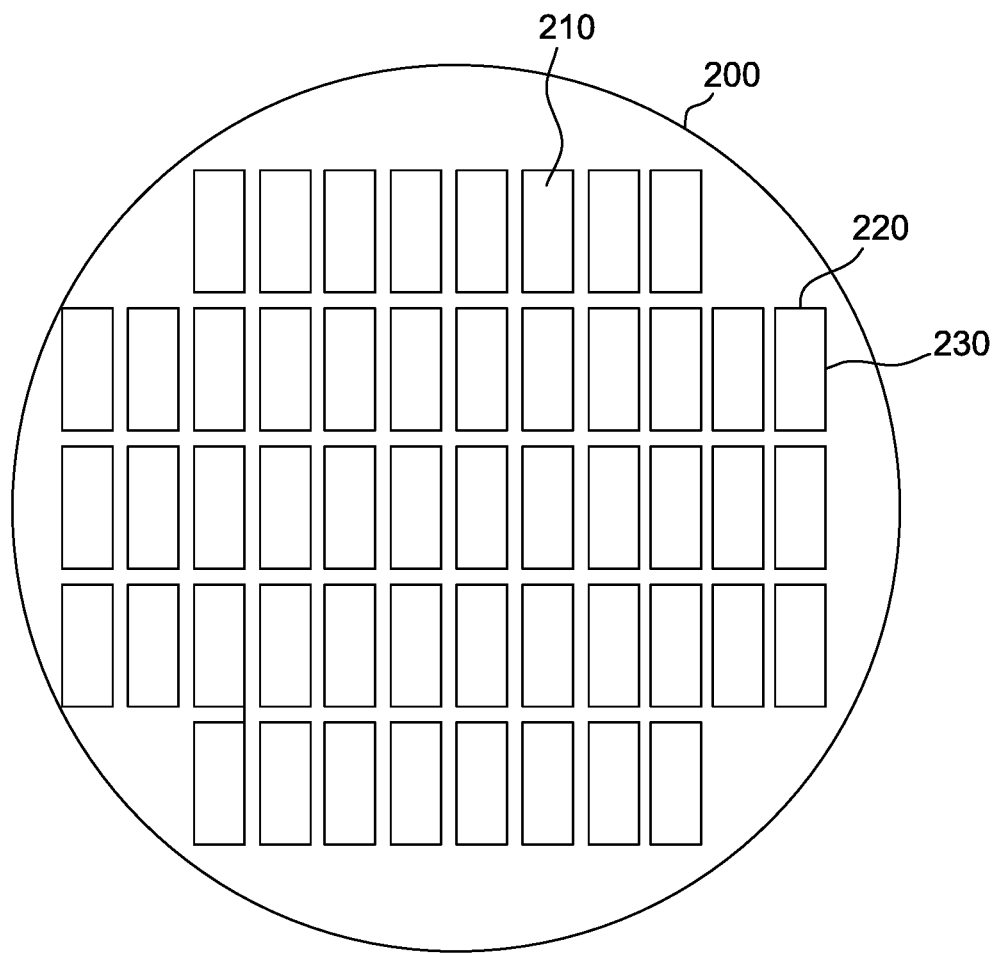
FIG. 6 illustrates results of the die separation ring of FIG. 3 expanding a semiconductor wafer, having dies with large aspect ratios, in a non-uniform manner according to an example.

As a result and as shown in FIG. 6, spacing between the short sides 220 of adjacent dies 210 in a semiconductor wafer 200 is uniform or substantially uniform with the spacing between the long sides 230 of adjacent dies 210 in the semiconductor wafer 200. Uniform spacing between the dies 210 in the manner shown in FIG. 6 helps address the problems described above. Namely, the uniform spacing enabled by the die separation ring 300 of the present disclosure address potential issues of dies not fully separating during a wafer expansion process and/or dies not being recognized during a wafer/image recognition process.

Figure 7:
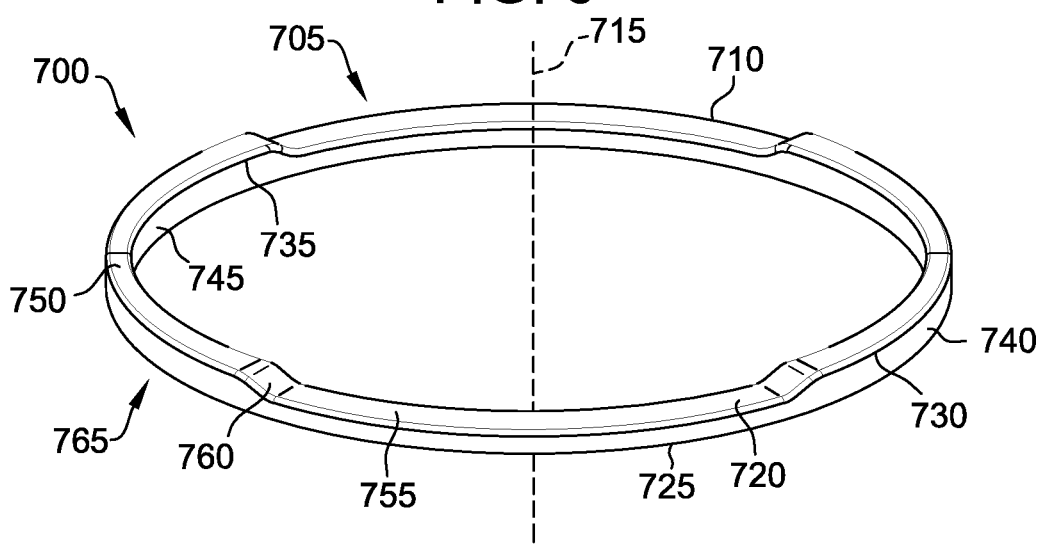
FIG. 7 illustrates another example die separation ring that may be used to separate dies having large aspect ratios according to an example.

FIG. 7 illustrates a die separation ring 700 for separating dies having a large aspect ratio (e.g., an aspect ratio of 4:1 or greater) according to another example. As with the die separation ring 300 (FIG. 3), the die separation ring 700 may be used in a die separation device or wafer expander device that performs a die separation or wafer expansion process. For example, the die separation ring 700 may be used in any die separation device (e.g., die separation device 100) that currently uses a typical expansion ring (e.g., expansion ring 150 (FIG. 1A)).

Like the die separation ring 300 shown and described with respect to FIG. 3, the die separation ring 700 may be made of any suitable material including but not limited to metal, aluminum, steel, stainless steel or the like. In another example, the die separation ring 700 may be made of a polymer.

The die separation ring 700 includes an annular body 710 extending about a central axis 715. The die separation ring 700 may have a radius of one hundred seventy millimeters. In another example, the radius of the die separation ring 700 may be greater than one hundred seventy millimeters or less than one hundred seventy millimeters. The die separation ring 700 may have a width of ten millimeters. In other examples, the die separation ring 700 may have a width less than ten millimeters or greater than ten millimeters. The die separation ring 700 may include an inner sidewall 745 and an outer sidewall 740. The inner sidewall 745 and the outer sidewall 740 may extend circumferentially about the center axis 715. The inner sidewall 745 may define an inner radius and the outer sidewall 740 may define an outer radius. As such, a width of the annular body 710 may be defined by a difference between the inner radius and the outer radius.

The annular body 710 has a top 705 and a bottom 765. The top 705 includes a top surface 720 and the bottom 765 includes a bottom surface 725 that is opposite from the top surface 720. In an example, the top surface 720 (or portions of the top surface 720) are planar or substantially planar. However, in this example, the entire bottom surface 725 is planar or substantially planar.

The annular body 710 (including both the top 705 and the bottom 765 of the annular body 710) may include an outer edge 730 and an inner edge 735. In an example, the outer edge 730 connects the top surface 720 to the outer sidewall 740. Likewise, the inner edge 735 connects the top surface 720 to the inner sidewall 745 that is opposite from the outer sidewall 740. The inner sidewall 745 and the outer sidewall 740 extend between the top surface 720 and the bottom surface 725.

In an example, the inner edge 730 and/or the outer edge 735 may be rounded. In another example, the inner edge 730 and/or the outer edge 735 may be angled with respect to top surface 720, the inner sidewall 745 and/or the outer sidewall 740. In yet other examples, the inner edge 730 and/or the outer edge 735 may have any shape that reduces sharp edges of the die separation ring 700.

The top surface 720 of the die separation ring 700 may be configured in a "wave" or an "S" shape. For example and as shown in FIG. 7, the die separation ring 700 may include a first portion 750 and a second portion 755. The top surface 720 of the first portion 750 may be elevated and/or otherwise have a greater height with respect to the top surface 720 of the second portion 755. For example, because the bottom surface 725 is substantially planar about the circumference of the annular body 710, the first portion 750 may have a greater height (when measuring from the bottom surface 725 to the top surface 720) when compared to a height of the second portion 755 (when measuring from the bottom surface 725 to the top surface 720).

The die separation ring 700 may also include a third portion 760 or transition portion. The third portion 760 extends between the first portion 750 and the second portion 755. In an example, the top surface 720 and/or the bottom surface 725 of the third portion 760 is non-planar. For example, the third portion 760 may extend from the first portion 750 to the second portion 755 at a slope or an angle. As a result, a height of the third portion 760 may increase based, at least in part, on the degree or slope of the transition portion. In another example, the third portion 760 may be rounded. In yet another example, the third portion 760 may have a "step" shape (e.g., have an angle of approximately ninety degrees) with respect to the top surface 720 of the first portion 750 and/or the top surface 720 of the second portion 755.

In some examples, a difference in elevation or height between the top surface 720 of the first portion 750 and the top surface 720 of the second portion 755 is approximately three millimeters or less. In another example, the difference in elevation or height between the top surface 720 of the first portion 750 and the top surface 720 of the second portion 755 is approximately four millimeters or less. Although three and four millimeters are specifically mentioned, the difference in elevation or height between the top surface 720 of the first portion 750 and the top surface 720 of the second portion 755 may be greater than four millimeters.

For instance, in some examples, the difference in elevation or height between the top surface 720 of the first portion 750 and the top surface 720 of the second portion 755 is based on, or is otherwise proportional to, a die aspect ratio of a die in a semiconductor wafer. For example, if the die aspect ratio of the die in semiconductor wafer is 4:1, the difference in elevation or height between the top surface 720 of the first portion 750 and the top surface 720 of the second portion 755 may be four millimeters. However, if the die aspect ratio of the die in semiconductor wafer is 5:1, the difference in elevation or height between the top surface 720 of the first portion 750 and the top surface 720 of the second portion 755 may be five millimeters. Although specific die aspect ratios and elevations are given, these are for example purposes only.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A die separation ring, comprising:
an annular body extending about a central axis, the annular body having a top and a bottom, the top comprising:
a first planar surface having a first elevation with respect to the bottom of the annular body;
a second planar surface having a second elevation with respect to the bottom of the annular body, the second elevation being lower than the first elevation; and
a transition surface extending between the first planar surface and the second planar surface, wherein:
the first planar surface is arranged to contact expansion material associated with a semiconductor wafer to cause the expansion material to expand in a first direction when the die separation ring moves in a direction parallel to the central axis from a first position to a second position; and the second planar surface is arranged to contact the expansion material associated with the semiconductor wafer to cause the expansion material to expand in a second direction when the die separation ring moves from the first position to the second position, the expansion in the second direction being less than the expansion in the first direction.

2. The die separation ring of claim 1, wherein a difference between the first elevation and the second elevation is approximately three millimeters.

3. The die separation ring of claim 1, wherein a difference between the first elevation and the second elevation is proportional to an aspect ratio of a die associated with the semiconductor wafer.

4. The die separation ring of claim 1, wherein the annular body comprises an inner sidewall and an outer sidewall extending circumferentially about the central axis.

5. The die separation ring of claim 4, wherein the top of the annular body further comprises:
an inner edge and an outer edge; and
the inner sidewall extends from the inner edge to the bottom of the annular body and the outer sidewall extends from the outer edge to the bottom of the annular body.

6. The die separation ring of claim 1, wherein the inner sidewall defines an inner radius and the outer sidewall defines an outer radius and wherein a width of the die separation ring is a difference between the inner radius and the outer radius.

7. The die separation ring of claim 1, wherein the bottom of the annular body comprises a bottom surface and wherein the bottom surface is planar.

8. A die separation ring, comprising:
a ring structure;
a first substantially planar portion having a first height;
a second substantially planar portion having a second height that is lower than the first height; and
a transition portion connecting the first substantially planar portion and the second substantially planar portion.

9. The die separation ring of claim 8, wherein:
the first substantially planar portion is arranged to contact expansion material associated with a semiconductor wafer to cause the expansion material to expand in a first direction by a first amount; and
the second substantially planar portion is arranged to contact the expansion material associated with the semiconductor wafer to cause the expansion material to expand in a second direction by a second amount, the first amount being greater than the second amount.

10. The die separation ring of claim 8, wherein a difference between the first height and the second height is proportional to an aspect ratio of a die associated with a semiconductor wafer.

11. The die separation ring of claim 8, wherein a difference between the first height and the second height is at least three millimeters.

12. The die separation ring of claim 8, further comprising an inner sidewall and an outer sidewall, wherein each of the inner sidewall and the outer sidewall extend circumferentially about a central axis of the die separation ring.

13. The die separation ring of claim 12, further comprising an inner edge and an outer edge, wherein the inner sidewall extends from the inner edge to a bottom of the die separation ring and the outer sidewall extends from the outer edge to the bottom of the die separation ring.

14. The die separation ring of claim 13, wherein at least one of the inner edge and the outer edge is rounded.

15. A die separation ring, comprising:
an annular body extending about a central axis, the annular body having a top and a bottom, the top comprising:
a first expansion means having a first elevation with respect to the bottom of the annular body;
a second expansion means having a second elevation with respect to the bottom of the annular body, the second elevation being lower than the first elevation; and
a surface extending between the first expansion means and the second expansion means wherein:
the first expansion means causes an expansion material associated with a semiconductor wafer to expand in a first direction; and
the second expansion means causes the expansion material associated with the semiconductor wafer to expand in a second direction, the expansion in the second direction being less than the expansion in the first direction.

16. The die separation ring of claim 15, wherein a difference between the first elevation and the second elevation is approximately three millimeters.

17. The die separation ring of claim 15, wherein a difference between the first elevation and the second elevation is proportional to an aspect ratio of a die associated with the semiconductor wafer.

18. The die separation ring of claim 15, wherein:
the first expansion means is a first planar surface; and
the second expansion means is a second planar surface.

19. The die separation ring of claim 15, further comprising:
an inner rounded edge that extends to an inner sidewall of the annular body, the inner sidewall extending circumferentially about the central axis; and
and an outer rounded edge that extends to an outer sidewall of the annular body opposite the inner sidewall, wherein each of the inner sidewall and the outer sidewall transition to the bottom of the annular body.

20. The die separation ring of claim 15, wherein the bottom of the annular body comprises a bottom surface and wherein the bottom surface is planar.

* * * * *